(12) United States Patent
Itou et al.

(10) Patent No.: US 12,376,225 B2
(45) Date of Patent: Jul. 29, 2025

(54) WIRING BOARD, ELECTRONIC DEVICE, AND ELECTRONIC MODULE

(71) Applicant: KYOCERA Corporation, Kyoto (JP)

(72) Inventors: Seiichirou Itou, Kyoto (JP); Reika Nishiuchi, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 481 days.

(21) Appl. No.: 17/761,412

(22) PCT Filed: Sep. 18, 2020

(86) PCT No.: PCT/JP2020/035422
§ 371 (c)(1),
(2) Date: Mar. 17, 2022

(87) PCT Pub. No.: WO2021/054435
PCT Pub. Date: Mar. 25, 2021

(65) Prior Publication Data
US 2022/0353987 A1 Nov. 3, 2022

(30) Foreign Application Priority Data
Sep. 20, 2019 (JP) ................. 2019-171008

(51) Int. Cl.
H05K 1/02 (2006.01)
H05K 1/11 (2006.01)
(52) U.S. Cl.
CPC .......... *H05K 1/0271* (2013.01); *H05K 1/111* (2013.01); *H05K 2201/09045* (2013.01); *H05K 2201/0939* (2013.01); *H05K 2201/09409* (2013.01); *H05K 2201/09418* (2013.01)

(58) Field of Classification Search
CPC ................ H05K 1/0271; H05K 1/111; H05K 2201/09045; H05K 2201/0939
USPC ......................................... 361/760
See application file for complete search history.

(56) References Cited

U.S. PATENT DOCUMENTS

| 5,448,113 | A | * | 9/1995 | Suzuki | ................ H01L 23/5329 |
| | | | | | 257/765 |
| 8,951,048 | B2 | * | 2/2015 | Seok | ...................... H05K 1/117 |
| | | | | | 439/59 |
| 2003/0197199 | A1 | | 10/2003 | Sakamoto et al. | |

(Continued)

FOREIGN PATENT DOCUMENTS

| JP | 05-291560 A | 11/1993 |
| JP | 05-315283 A | 11/1993 |

(Continued)

*Primary Examiner* — Andargie M Aychillhum
(74) *Attorney, Agent, or Firm* — Volpe Koenig

(57) ABSTRACT

A wiring board including a component mounting portion with an increased strength is provided. In addition, an electronic device and an electronic module with high reliabilities are provided. The wiring board includes a base having a first face and a conductor positioned on the first face. The conductor has a region in which a plurality of first protrusions are positioned on a surface of the conductor, the plurality of first protrusions protruding in a same oblique direction that is oblique to a direction normal to the first face. The electronic device and the electronic module include the above-described wiring board and an electronic component mounted on the wiring board.

19 Claims, 10 Drawing Sheets

(56) References Cited

U.S. PATENT DOCUMENTS

2006/0237841 A1* 10/2006 Matsumura ....... H01L 23/49811
                                                              257/E21.511
2012/0062881 A1*  3/2012 Sakagami ............ G01N 21/658
                                                                  356/301

FOREIGN PATENT DOCUMENTS

| JP | 07-176615 A  | 7/1995 |
| JP | 2001-244626 A | 9/2001 |

\* cited by examiner

WIRING BOARD, ELECTRONIC DEVICE, AND ELECTRONIC MODULE

TECHNICAL FIELD

The present disclosure relates to a wiring board, an electronic device, and an electronic module.

BACKGROUND

Many electronic devices include a wiring board including a base and a thin film conductor formed on a principal surface of the base (see, for example, Japanese Unexamined Patent Application Publication No. 2001-244626).

SUMMARY

A wiring board according to the present disclosure includes a base having a first face and a conductor positioned on the first face. The conductor has a region in which a plurality of first protrusions are positioned on a surface of the conductor, the plurality of first protrusions protruding in a same oblique direction that is oblique to a direction normal to the first face.

An electronic device according to the present disclosure includes the above-described wiring board and an electronic component mounted on the wiring board.

An electronic module according to the present disclosure includes the above-described electronic device and a module substrate on which the electronic device is mounted.

DETAILED DESCRIPTION

Embodiments of the present disclosure will now be described in detail with reference to the drawings.

First Embodiment

Figure 1:
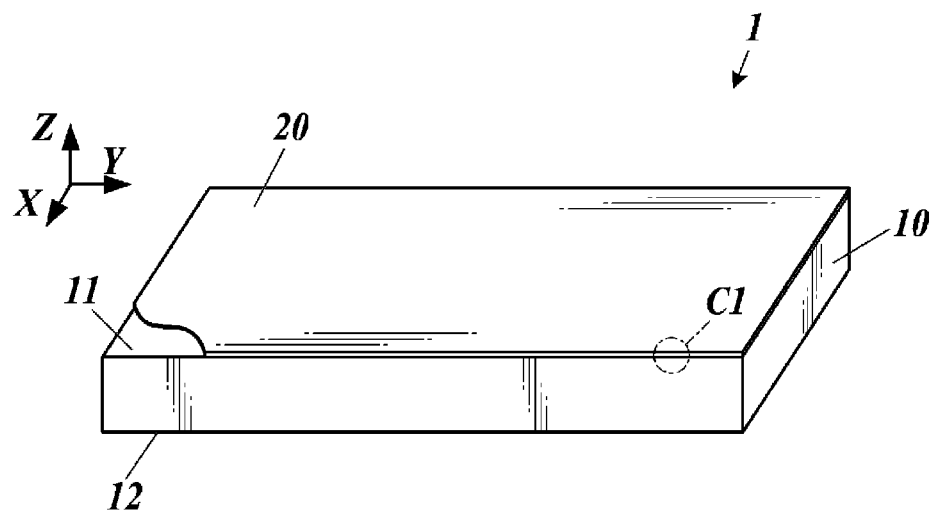
FIG. 1 is a perspective view of a wiring board according to a first embodiment of the present disclosure.

FIG. 1 is a perspective view of a wiring board according to a first embodiment of the present disclosure. In FIG. 1, a conductor 20 is partially cut away. A wiring board 1 according to the first embodiment includes a base 10 having a first face 11 and a conductor 20 that extends over the first face 11. The base 10 may be composed of an aluminum oxide ($Al_2O_3$) based sintered body, which is an insulator, a silicon carbide (SiC) substrate, which is a conductor, or other materials. The conductor 20 may be a thin film conductor, and may be formed by a sputtering method or a deposition method, such as vacuum deposition or chemical vapor deposition (CVD). Although the conductor 20 extends over the entire area of the first face 11 of the base 10 in FIG. 1, the conductor 20 may instead be formed on the first face 11 in any pattern. The conductor 20 may be provided on each of the first face 11 and a second face 12.

Figure 2:
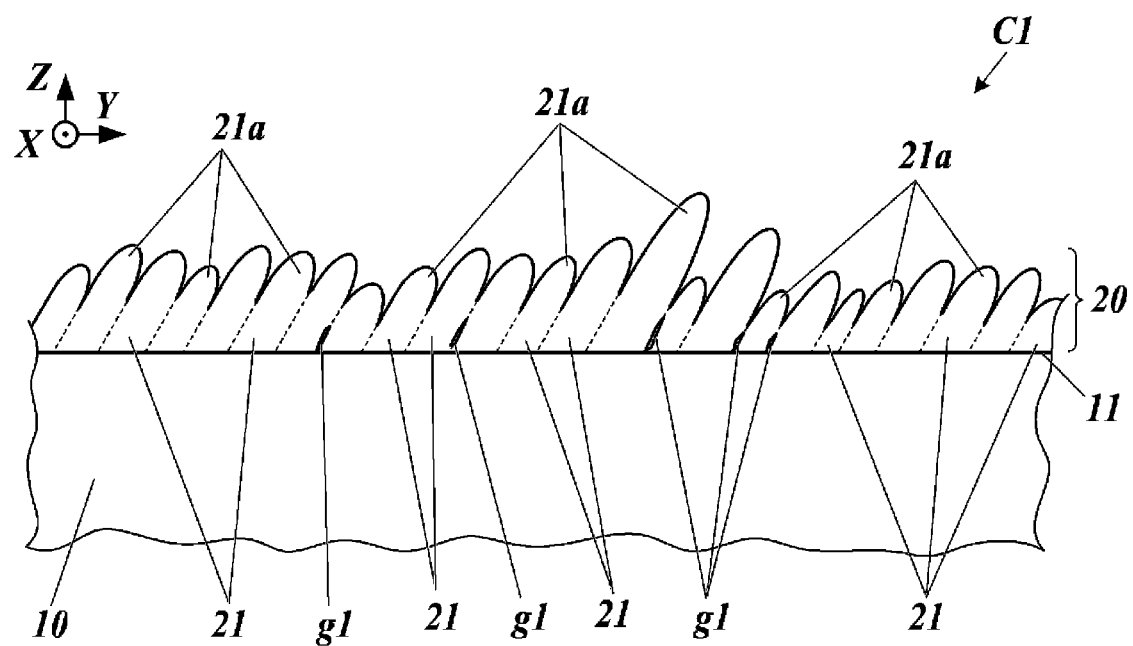
FIG. 2 is a conceptual diagram illustrating the structure of a surface of the wiring board illustrated in FIG. 1.

FIG. 2 is a conceptual diagram (sectional view) illustrating the structure of a surface of the wiring board illustrated in FIG. 1. In FIG. 2 and FIGS. 3 to 5 described below, cross-hatching is omitted for convenience. The conductor 20 has a region in which a plurality of first protrusions 21a are positioned on a surface thereof. The first protrusions 21a protrude in the same oblique direction that is oblique to the Z direction. The above-described region may extend over either the entire area or a portion of the conductor 20. The region extends in the X direction and the Y direction, and many first protrusions 21a may be arranged in the X direction and the Y direction. The Z direction corresponds to a direction normal to the first face 11. The X direction and the Y direction are two directions that extend along the first face 11 and that are orthogonal to each other. The conductor 20 may have a structure including many granules 21 arranged in a certain direction, and the first protrusions 21a may be end portions of the granules 21. The granules 21 may be either crystalline grains or polycrystalline grains. The end portion of each granule 21 has a width less than the width of a body portion of the granule 21, and the body portions of adjacent ones of the granules 21 are in contact with each other. The granules 21 may be distinguished from each other by forming a cross section thereof with an ion beam, such as a focused ion beam (FIB), and observing the cross section with an electron microscope, such as a scanning electron microscope (SEM).

As described above, the first protrusions 21a protrude in a direction oblique to the Z direction. The long-side direction of each granule 21 is inclined with respect to the Z direction. The inclination angle may be in the range of, for example, 10° to 60° or 35° to 55°. The first protrusions 21a protrude in substantially the same direction (for example, direction inclined by a certain angle from the Z direction toward the Y direction).

Figure 3:
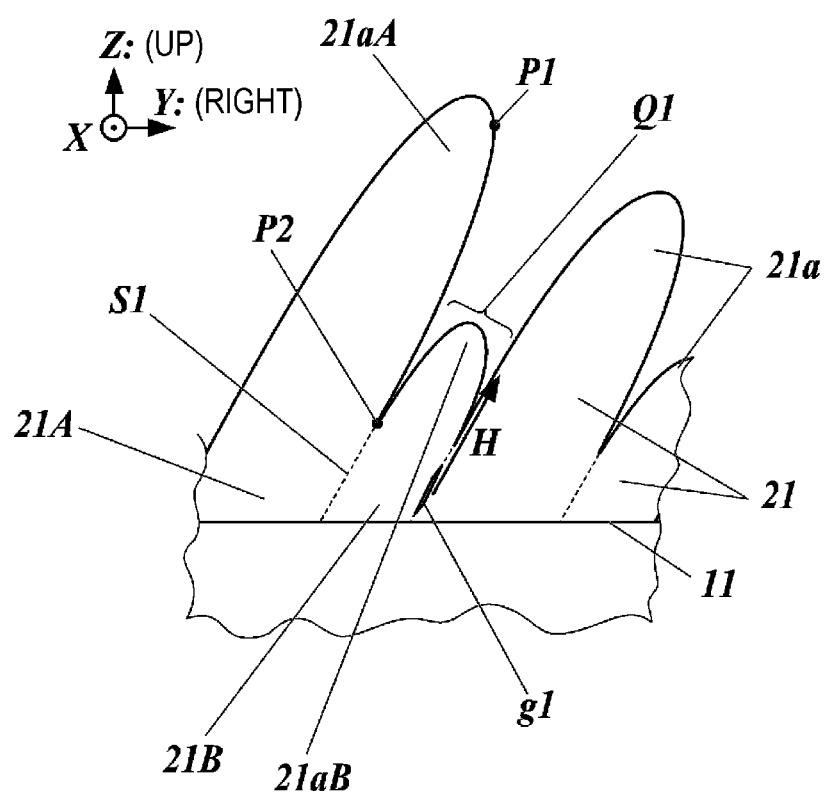
FIG. 3 is a diagram illustrating the detailed structure of a surface of a thin film conductor.

FIG. 3 is a diagram (sectional view) illustrating the detailed structure of a surface of the conductor. Here, assume that the Y direction (direction toward which the first protrusions 21a are inclined) is rightward and the Z direction is upward.

As illustrated in FIG. 3, in a cross section orthogonal to the first face 11, the conductor 20 includes a portion in which a section Q1 adjacent to a first protrusion 21aA has an outline curved convexly in a direction coinciding with the oblique direction in which the first protrusions 21a protrude. In other words, in the above-described portion, two first protrusions 21aA and 21aB are adjacent to each other. Assume that the granules 21 include two granules 21A and 21B that are adjacent to each other in the left-right direction and that the first protrusions 21a include the first protrusions 21aA and 21aB of the granules 21A and 21B, respectively. A right end P1 of the left first protrusion 21aA is to the right and above a contact end P2 between the left and right first protrusions 21aA and 21aB. The cross section is orthogonal to corners between the first face 11 and side faces of the base 10, and extends along the Y-Z plane in the example illustrated in FIGS. 2 and 3.

According to the above-described structure, if an electronic component is mounted on the wiring board 1 with a joining material, such as solder or conductive paste, the joining material enters the space between the two adjacent first protrusions 21aA and 21aB and is cured. Then, if a tensile force is applied to the electronic component in the Z direction, the cured joining material is caught in the region between the contact end P2 of the pair of first protrusions 21aA and 21aB and the right end P1 of the first protrusion 21aA and exhibits an anchoring effect that increases the strength between the cured joining material and the conductor 20. Accordingly, even if a large force is applied to the electronic component, the electronic component is not easily separated from the wiring board 1.

As illustrated in FIG. 3, in the cross section perpendicular to the first face 11, the direction in which a boundary line S1 between the pair of first protrusions 21aA and 21aB that are adjacent to each other in the left-right direction extends is the direction coinciding with the oblique direction in which the first protrusions 21a protrude. The boundary line S1 is the section line of the interface between the pair of granules 21A and 21B that are adjacent to each other in the left-right direction. The interface corresponds to a grain boundary if the granules 21A and 21B are crystalline grains, and corresponds to an interface (grain boundary) between crystalline grains that belong to the granule 21A and crystalline grains that belong to the granule 21B if the granules 21A and 21B are polycrystalline grains.

Figure 4A:
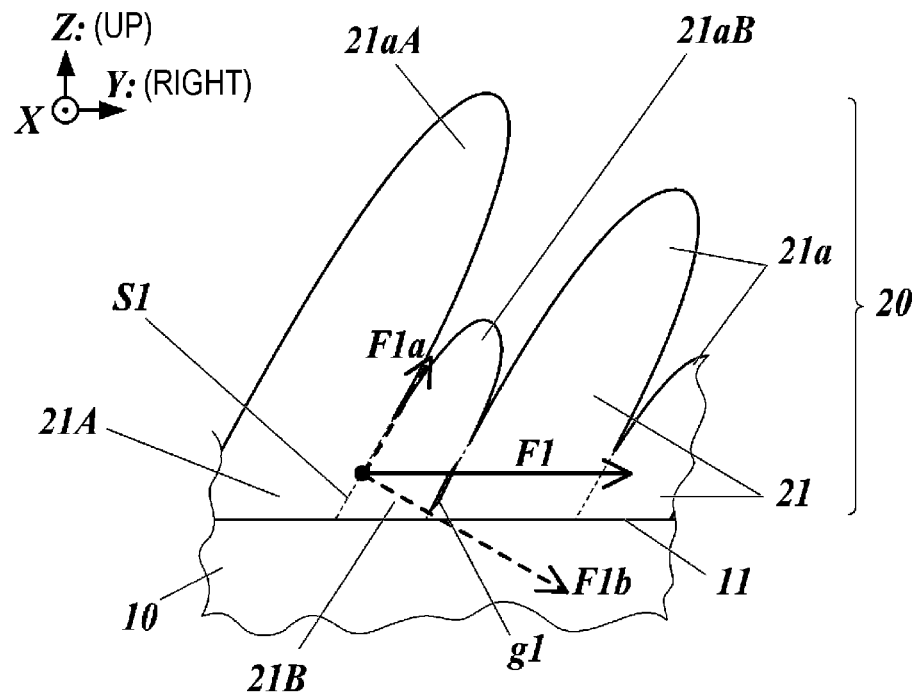
FIG. 4A is a diagram illustrating the stress generated in the conductor.
Figure 4B:
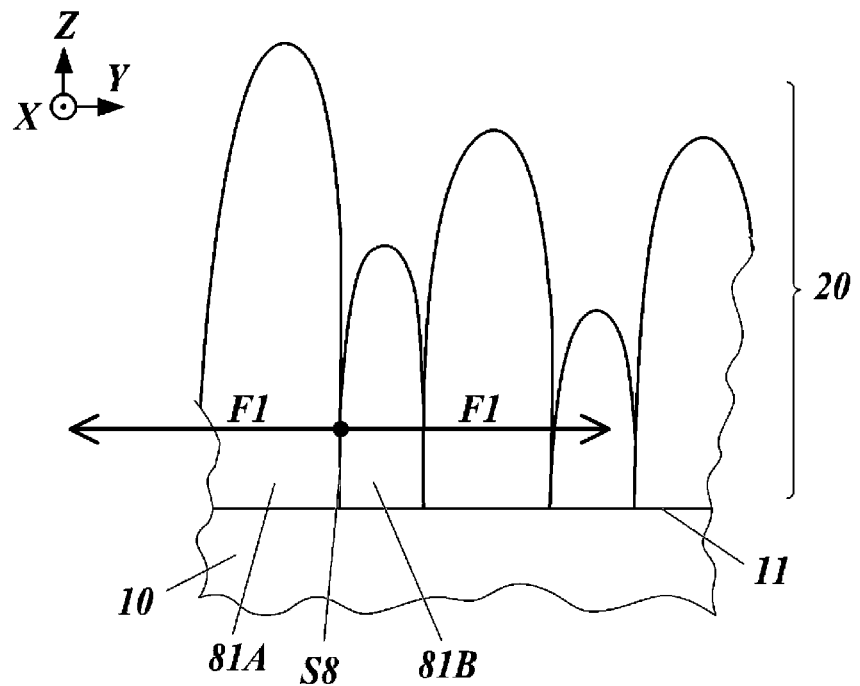
FIG. 4B is a diagram illustrating the stress generated in a conductor according to a comparative example.

FIG. 4A is a diagram (sectional view) illustrating the stress generated in the conductor. FIG. 4B is a diagram (sectional view) illustrating the stress generated in a conductor according to a comparative example. Due to a difference in coefficient of thermal expansion between the conductor 20 and the base 10, if the conductor 20 is cooled after a high-temperature formation process, a stress F1 may be generated in the conductor 20 in a direction along the first face 11. In such a case, if an interface S8 between granules 81A and 81B extends in the Z direction as in the comparative example illustrated in FIG. 4B, the stress F1 is directly applied in a direction in which separation occurs at the interface S8. In contrast, if the boundary line S1 is inclined with respect to the Z direction as in the first embodiment illustrated in FIG. 4A, a component F1a of the stress F1 is directed in a direction along the boundary line S1, and a component F1b of the stress F1 in a direction in which separation occurs at the interface (boundary line S1) is reduced. Therefore, the disruptive strength of the conductor 20 against the stress is increased, and cracks are not easily formed in the conductor 20 due to the stress. As a result, the occurrence of mounting failure of the electronic component due to breakage of the conductor 20 can be reduced.

As illustrated in FIGS. 2 and 3, a plurality of cavities g1 are formed in the conductor 20 in the region in which the first protrusions 21a are provided. Each space g1 corresponds to a gap between an adjacent pair of the granules 21. In the cross section perpendicular to the first face 11, the long-side direction of each space g1 is the oblique direction coinciding with the direction in which the first protrusions 21a protrudes.

According to the above-described structure, if the stress F1 (see FIG. 4A) is generated in the conductor 20 due to a difference in coefficient of thermal expansion between the conductor 20 and the base 10, the inclined cavities g1 serve to buffer the stress F1 in the direction along the first face 11 and the direction perpendicular to the first face 11. More specifically, the cavities g1 are reduced in size in the short-side direction thereof to exhibit the buffering effect. Since the long-side direction H and the short-side direction of each space g1 are oblique to the first face 11, the cavities g1 exhibit the buffering effect in the direction along the first face 11 and the direction perpendicular to the first face 11. Due to the above-described buffering effect, the impact applied in the direction in which the conductor 20 is separated from the base 10 is reduced. Accordingly, the conductor is not easily separated. As a result, the occurrence of mounting failure of the electronic component due to separation of the conductor 20 can be reduced.

As described above, according to the wiring board 1 of the first embodiment, the first protrusions 21a on the surface of the conductor 20 protrude obliquely to the Z direction. Accordingly, if the electronic component is mounted, the strength of the mounting portion can be increased.

Second Embodiment

Figure 5:
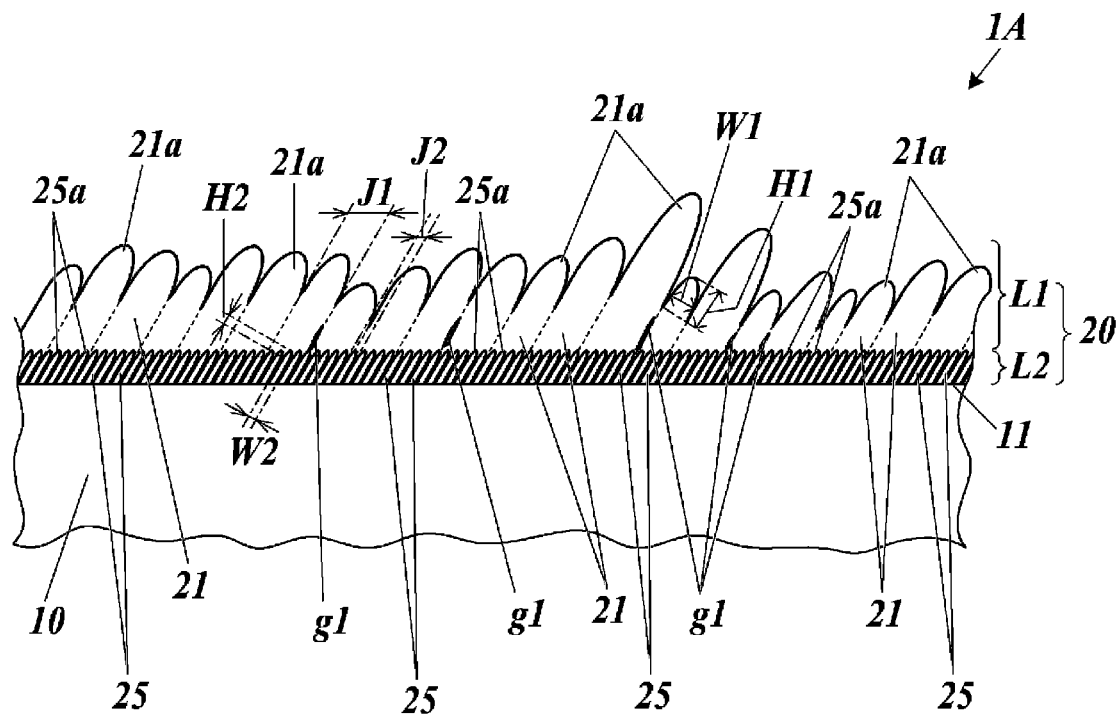
FIG. 5 is a conceptual diagram illustrating the structure of a surface of a wiring board according to a second embodiment.

FIG. 5 is a conceptual diagram (sectional view) illustrating the structure of a surface of a wiring board according to a second embodiment of the present disclosure. A wiring board 1A according to the second embodiment includes a conductor 20 including a first layer L1 and a second layer L2 that is in contact with the first layer L1 and positioned on the first face 11. The first layer L1 may be, for example, a main conductor layer made of a metal having a low electrical resistance, such as gold (Au) or copper (Cu). The second layer L2 may be, for example, an adhesion layer made of a highly adhesive metal, such as titanium (Ti), or a barrier layer positioned between an adhesion layer and the main conductor layer.

The second layer L2 has a region in which a plurality of second protrusions 25a are positioned. The second protrusions 25a protrude in the same oblique direction that is oblique to the Z direction. Many second protrusions 25a may be arranged in the X direction and the Y direction. The second layer L2 may include many granules 25 arranged in a certain direction. The second protrusions 25a may be end portions of the granules 25. The granules 25 may be either crystalline grains or polycrystalline grains. The end portion of each granule 25 has a width less than the width of a body portion of the granule 25, and the body portions of adjacent ones of the granules 25 are in contact with each other.

First protrusions 21a and granules 21 of the first layer L1 are similar to those described in the first embodiment except that they are in contact with the second layer L2 and disposed on the second layer L2. The direction in which the second protrusions 25a and the granules 25 of the second layer L2 are oriented and the direction in which the first protrusions 21a and the granules 21 of the first layer L1 are oriented may be either substantially the same direction or different oblique directions. In the region in which the second protrusions 25a of the second layer L2 are provided, the first layer L1 is present between the second protrusions 25a in a lower section thereof. In this region, the first layer L1 may have portions sandwiched between the second protrusions 25a of the second layer L2 in the lower section thereof.

The second protrusions 25a have a width W2 less than a width W1 of the first protrusions 21a. The second protrusions 25a have a height H2 less than a height H1 of the first protrusions 21a. The second protrusions 25a are arranged at a pitch J2 less than a pitch J1 at which the first protrusions 21a are arranged. These comparisons may be based on averages excluding extreme values. The extreme values to be excluded may be highest 10% and lowest 10% of all values. The pitch J1 is, for example, 100 to 1000 [nm], and the pitch J2 is, for example, 10 to 100 [nm].

The wiring board 1A according to the second embodiment includes the first layer L1 including the first protrusions 21a. Therefore, similarly to the wiring board 1 according to the first embodiment, the strength of a joining portion of a mounted component can be increased. In addition, according to the wiring board 1A of the second embodiment, the second layer L2 is provided between the first layer L1 and the base 10. Furthermore, the second layer L2 has a region in which the second protrusions 25a are provided. The second protrusions 25a, which are arranged at a small pitch and have small dimensions, protrude obliquely to the Z direction. In the above-described region, the first layer L1 is present between the second protrusions 25a. Therefore, the base 10 and the first layer L1 can be strongly joined together. As a result, even if a large stress is generated in the conductor 20 due to a difference in coefficient of thermal expansion between the base 10 and the conductor 20, or if a very large force is applied to the mounted component, the conductor 20 is not easily separated from the base 10.

(Electronic Device and Electronic Module)

Figure 6:
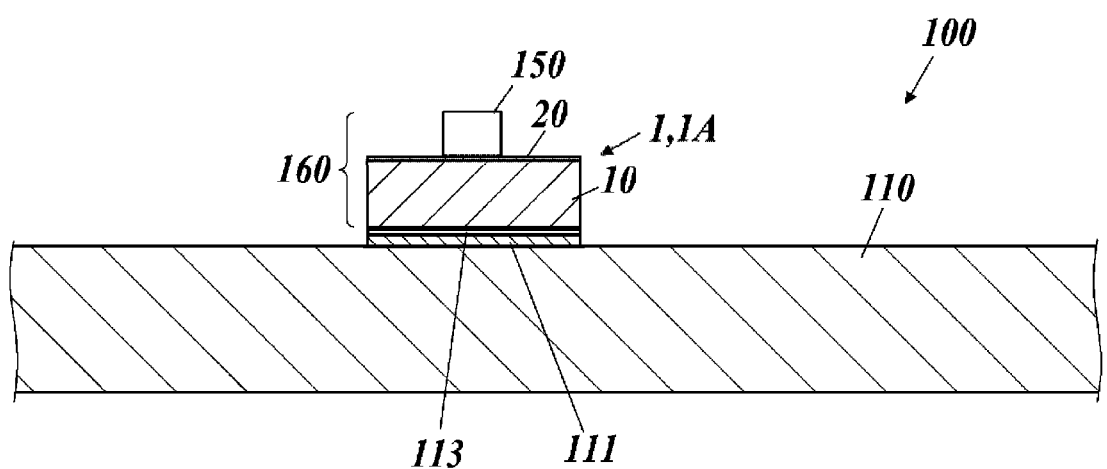
FIG. 6 is a sectional view of an electronic device and an electronic module according to an embodiment.

FIG. 6 is a sectional view of an electronic device and an electronic module according to an embodiment.

An electronic device 160 according to the present embodiment includes the wiring board 1 (or wiring board 1A) and an electronic component 150 mounted on the wiring board 1 or 1A. The electronic component 150 may be various types of electronic components, and examples thereof include an optical element, an imaging element, a piezoelectric vibrator such as a crystal vibrator, various types of sensors such as a motion sensor, a surface acoustic wave device, a semiconductor device such as a semiconductor integrated circuit (IC) device, a capacitive element, an inductor element, and a resistor.

The electronic component 150 may be joined to the conductor 20 of the wiring board 1 or 1A with a joining material, such as solder or conductive paste. The conductor 20 may have a function of transmitting signals or electric power to or from the electronic component 150. Alternatively, the conductor 20 may have no electrical function and be joined to the electronic component 150 to support the electronic component 150.

An electronic module 100 according to the present embodiment includes a module substrate 110 and the electronic device 160 mounted on the module substrate 110. In addition to the electronic device 160, the module substrate 110 may also have other electronic devices, electronic elements, and electrical elements mounted thereon. An electrode pad 111 may be provided on the module substrate 110, and the electronic device 160 may be joined to the electrode pad 111 with a joining material 113, such as solder.

The electronic device 160 and the electronic module 100 according to the present embodiment include the wiring board 1 or 1A in which the mounting portion has a high strength and in which the conductor 20 and the base 10 are strongly joined together. Therefore, the reliability can be increased. Even if, for example, a strong vibration or a large acceleration is applied to the electronic device 160 or the electronic module 100, the occurrence of mounting failure of the electronic component 150 can be reduced, and the reliability can thus be increased.

The wiring board, the electronic device, and the electronic module according to the present disclosure are not limited to those in the above-described embodiments. For example, although the protrusions of the conductor have a smooth shape in the conceptual diagrams of the above-described embodiments, the protrusions may instead have an angular shape or a pointed shape. In addition, the protrusions may be provided over a portion of the surface of the conductor instead of the entire area thereof. In addition, the details described in the embodiments, such as the inclination angle and the pitch of the granules or the protrusions, may be changed as appropriate without departing from the spirit of the invention.

Third Embodiment

Figure 7:
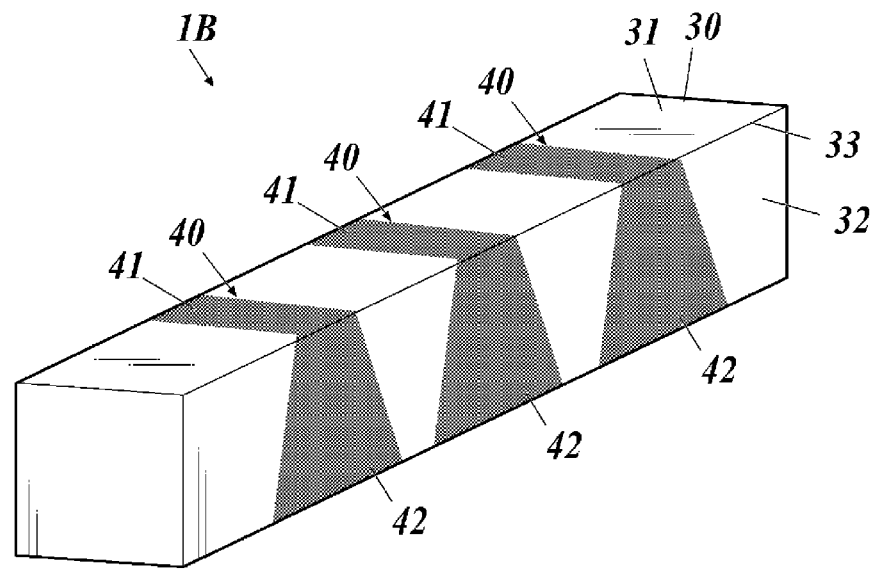
FIG. 7 is a perspective view of a wiring board according to a third embodiment.
Figure 8:
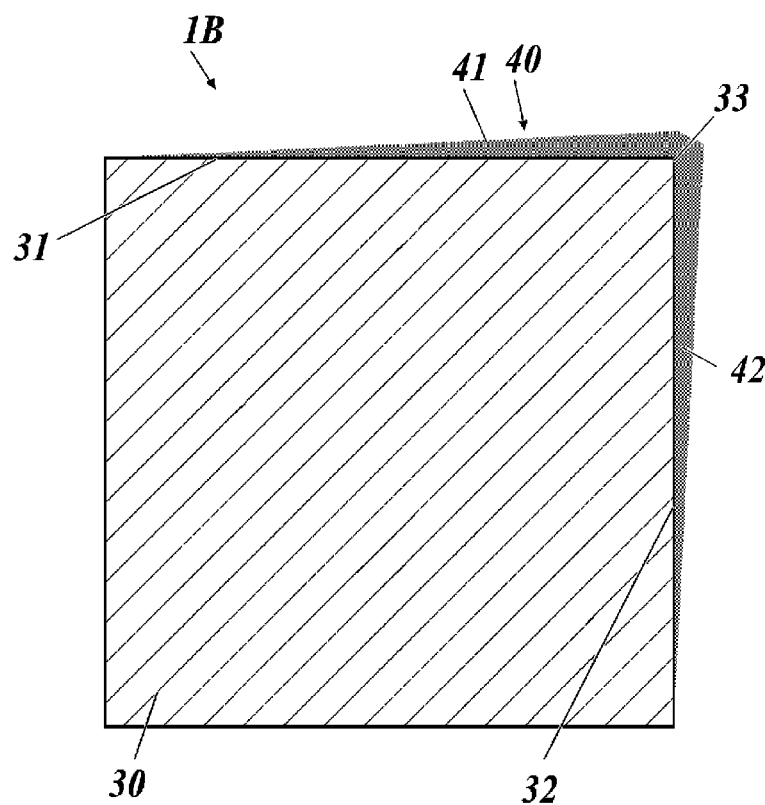
FIG. 8 is a sectional view of the wiring board illustrated in FIG. 7.

FIG. 7 is a perspective view of a wiring board according to a third embodiment. FIG. 8 is a sectional view of the wiring board according to the third embodiment. A wiring board 1B according to the third embodiment includes a base 30 having first faces 31 and 32 and conductors 40 positioned on the first faces 31 and 32. The base 30 is an insulator. The first faces 31 and 32 may be adjacent to each other with a corner portion 33 disposed therebetween. The first face 31 and the first face 32 may have different surface roughnesses. The conductors 40 include first conductors 41 positioned on the first face 31 and second conductors 42 positioned on the first face 32. The first conductors 41 may be connected to the second conductors 42 at the corner portion 33. The first conductors 41 and the second conductors 42 may have patterns of predetermined shapes on the first faces 31 and 32.

In addition, as illustrated in FIG. 8, the first conductors 41 may have a thickness that increases toward the corner portion 33. Similarly, the second conductors 42 may have a thickness that increases toward the corner portion 33.

The first conductors 41 have a plurality of first protrusions that protrude in the same oblique direction that is oblique to a direction normal to the first face 31. The first conductors 41 may also have a plurality of second protrusions that protrude in the same oblique direction that is oblique to the direction normal to the first face 31.

The second conductors 42 have a plurality of first protrusions that protrude in the same oblique direction that is oblique to a direction normal to the first face 32. The second conductors 42 may also have a plurality of second protrusions that protrude in the same oblique direction that is oblique to the direction normal to the first face 32.

The first protrusions and the second protrusions are similar to those described in the first and second embodiments.

The wiring board 1B may be structured such that a mounting section, in which an electronic component is mounted, is positioned on the first face 31 and that a wire connection section, which is subjected to wire bonding, is positioned on the first face 32.

Fourth Embodiment

Figure 9:
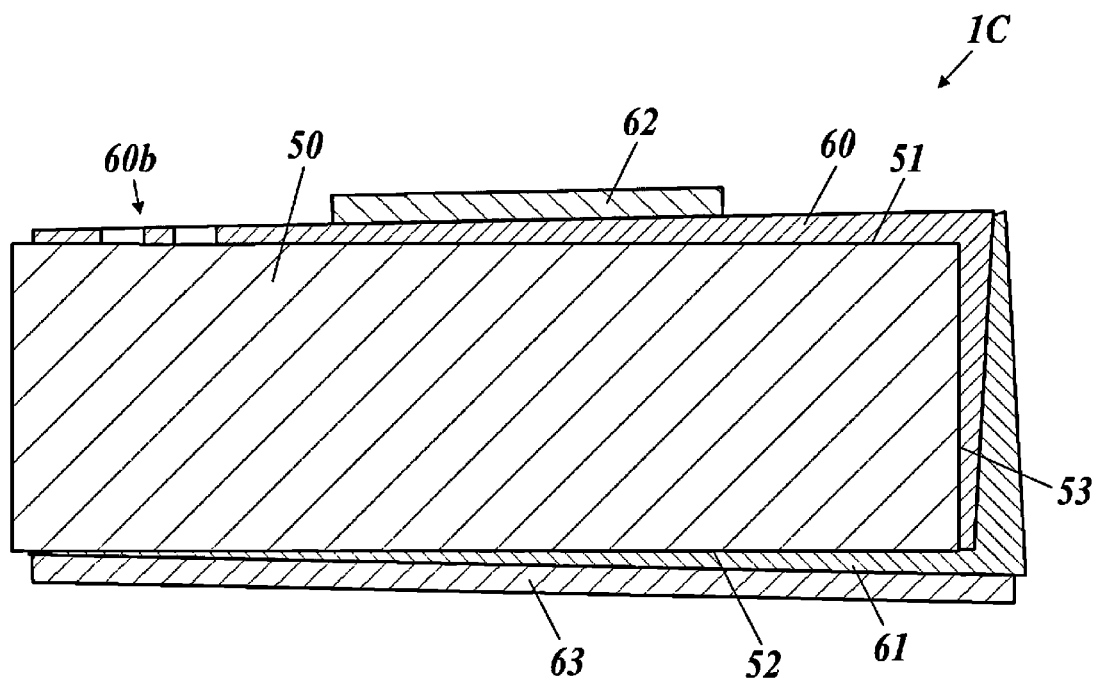
FIG. 9 is a sectional view of a wiring board according to a fourth embodiment.
Figure 10:
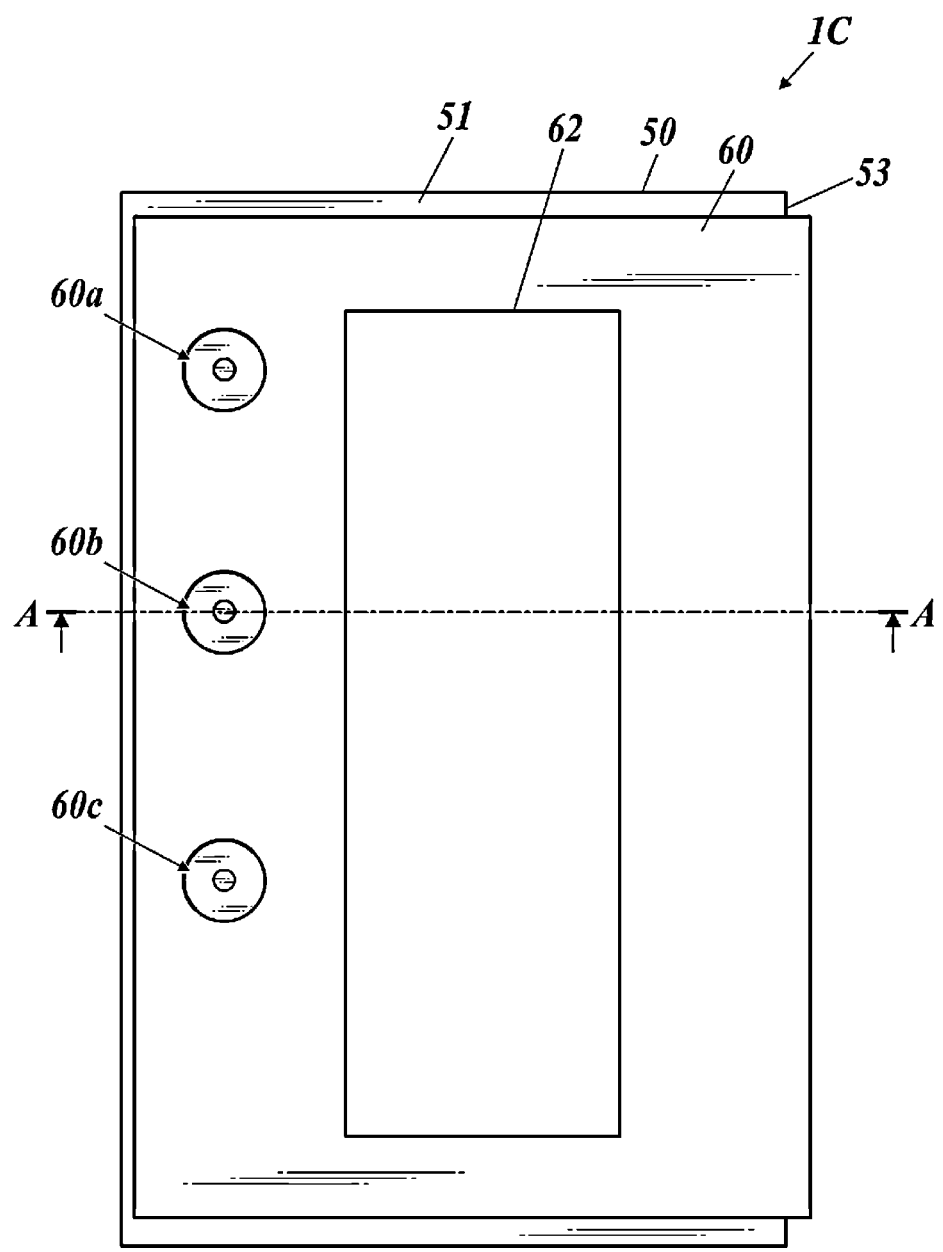
FIG. 10 is a plan view of the wiring board illustrated in FIG. 9.

FIG. 9 is a sectional view of a wiring board according to a fourth embodiment. FIG. 10 is a plan view of the wiring board according to the fourth embodiment. FIG. 9 shows a cross section of FIG. 10 taken along line A-A. A wiring board 1C according to the fourth embodiment includes a base 50 having a first face 51, a second face 52, and a side face 53; a metal film 60 positioned on both the first face 51 and the side face 53; a metal film 61 positioned on both the second face 52 and the side face 53; a wiring conductor 62 positioned on the metal film 60; and a wiring conductor 63 positioned on the metal film 61. The base 50 is an insulator. The first face 51 and the second face 52 face away from each other. The side face 53 is positioned between the first face 51 and the second face 52 and is adjacent to each of the first face 51 and the second face 52 with a corner portion provided therebetween. The metal film 60 has marks 60a to 60c (FIG. 10) formed in a predetermined pattern composed of sections in which the metal film 60 is formed and sections in which the metal film 60 is not formed.

The metal film 60 and the metal film 61 at least partially overlap on the side face 53. The metal film 60 has a thickness that increases toward the corner portion between the first face 51 and the side face 53. The metal film 61 has a thickness that increases toward the corner portion between the second face 52 and the side face 53.

In the wiring board 1C according to the fourth embodiment, the metal films 60 and 61 correspond to a conductor according to the present disclosure. A portion of the metal film 60 that is positioned on the first face 51 has a plurality of first protrusions that protrude in the same oblique direction that is oblique to a direction normal to the first face 51. The portion of the metal film 60 positioned on the first face 51 may also have a plurality of second protrusions that protrude in the same oblique direction that is oblique to the direction normal to the first face 51.

A portion of the metal film 60 that is positioned on the side face 53 (in a direction perpendicular to the side face 53) has a plurality of first protrusions that protrude in the same oblique direction that is oblique to a direction normal to the side face 53. The portion of the metal film 60 positioned on the side face 53 may also have a plurality of second protrusions that protrude in the same oblique direction that is oblique to the direction normal to the side face 53.

A portion of the metal film 61 that is positioned on the second face 52 has a plurality of first protrusions that protrude in the same oblique direction that is oblique to a direction normal to the second face 52. The portion of the metal film 61 positioned on the second face 52 may also have a plurality of second protrusions that protrude in the same oblique direction that is oblique to the direction normal to the second face 52.

A portion of the metal film 61 that is positioned on the side face 53 (in the direction perpendicular to the side face 53) has a plurality of first protrusions that protrude in the same oblique direction that is oblique to a direction normal to the side face 53. The portion of the metal film 61 positioned on the side face 53 may also have a plurality of second protrusions that protrude in the same oblique direction that is oblique to the direction normal to the side face 53.

In addition, in the wiring board 1C according to the fourth embodiment, the wiring conductors 62 and 63 may correspond to the conductor according to the present disclosure. More specifically, the wiring conductor 62 has a plurality of first protrusions that protrude in the same oblique direction that is oblique to a direction normal to the first face 51 or a surface of the metal film 60. The wiring conductor 62 may also have a plurality of second protrusions that protrude in the same oblique direction that is oblique to the direction normal to the first face 51 or the surface of the metal film 60. Similarly, the wiring conductor 63 has a plurality of first protrusions that protrude in the same oblique direction that is oblique to a direction normal to the second face 52 or a surface of the metal film 61. The wiring conductor 63 may also have a plurality of second protrusions that protrude in the same oblique direction that is oblique to the direction normal to the second face 52 or the surface of the metal film 61.

The first protrusions and the second protrusions are similar to those described in the first and second embodiments.

The wiring board 1C may be structured such that a mounting section, in which an electronic component is mounted, is positioned on the wiring conductor 62 and that a surface of the wiring conductor 63 serves as a joining surface to be joined to a module substrate with a joining material.

Fifth Embodiment

Figure 11:
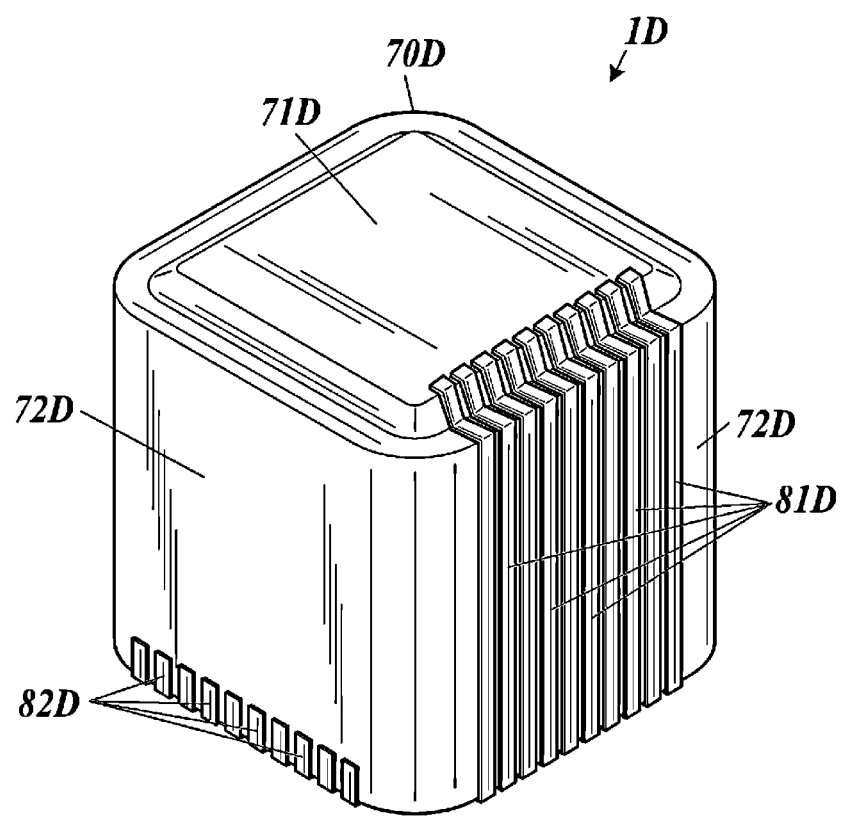
FIG. 11 is a perspective view of a wiring board according to a fifth embodiment.

FIG. 11 is a perspective view of a wiring board according to a fifth embodiment. A wiring board 1D according to the fifth embodiment includes a base 70D having three or more faces (an upper face 71D, one side face 72D having no wiring conductors 81D, and one side face that is not visible in FIG. 11) that are oriented in different directions and on each of which an electronic component can be mounted and one face (bottom face that is not visible in FIG. 11) that is to be joined to a module substrate. The upper face 71D and the bottom face of the base 70D have recessed steps at peripheral edges of the upper face 71D and peripheral edges of the bottom face. The base 70D is an insulator. In the base 70D, the upper face 71D, four side faces 72D, and the bottom face correspond to a first face according to the present disclosure.

The wiring board 1D also includes wiring conductors 81D and 82D positioned on surfaces of the base 70D. The wiring conductors 81D and 82D are conductors to be electrically connected to electrodes of electronic components mounted on the above-mentioned three or more faces with bonding wires or a conductive joining material, such as solder. The wiring conductors 81D are positioned to extend along the upper face 71D, one side face 72D, and the bottom face of the base 70D. The wiring conductors 82D are positioned to extend along the side face 72D and the bottom face of the base 70D.

The wiring conductors 81D and 82D correspond to the conductor according to the present disclosure. Portions of the wiring conductors 81D that are positioned on the upper face 71D have a plurality of first protrusions that protrude in the same oblique direction that is oblique to a direction normal to the upper face 71D. The portions of the wiring conductors 81D positioned on the upper face 71D may also have a plurality of second protrusions that protrude in the same oblique direction that is oblique to the direction normal to the upper face 71D.

Portions of the wiring conductors 81D that are positioned on the side face 72D have a plurality of first protrusions that protrude in the same oblique direction that is oblique to a direction normal to the side face 72D. The portions of the wiring conductors 81D positioned on the side face 72D may also have a plurality of second protrusions that protrude in the same oblique direction that is oblique to the direction normal to the side face 72D.

Portions of the wiring conductors 81D that are positioned on the bottom face of the base 70D have a plurality of first protrusions that protrude in the same oblique direction that is oblique to a direction normal to the bottom face. The portions of the wiring conductors 81D positioned on the bottom face may also have a plurality of second protrusions that protrude in the same oblique direction that is oblique to the direction normal to the bottom face.

Portions of the wiring conductors 82D that are positioned on the side face 72D have a plurality of first protrusions that protrude in the same oblique direction that is oblique to a direction normal to the side face 72D. The portions of the wiring conductors 82D positioned on the side face 72D may also have a plurality of second protrusions that protrude in the same oblique direction that is oblique to the direction normal to the side face 72D.

Portions of the wiring conductors 82D that are positioned on the bottom face of the base 70D have a plurality of first protrusions that protrude in the same oblique direction that is oblique to a direction normal to the bottom face. The portions of the wiring conductors 82D positioned on the bottom face may also have a plurality of second protrusions that protrude in the same oblique direction that is oblique to the direction normal to the bottom face.

The first protrusions and the second protrusions are similar to those described in the first and second embodiments.

Sixth Embodiment

Figure 12:
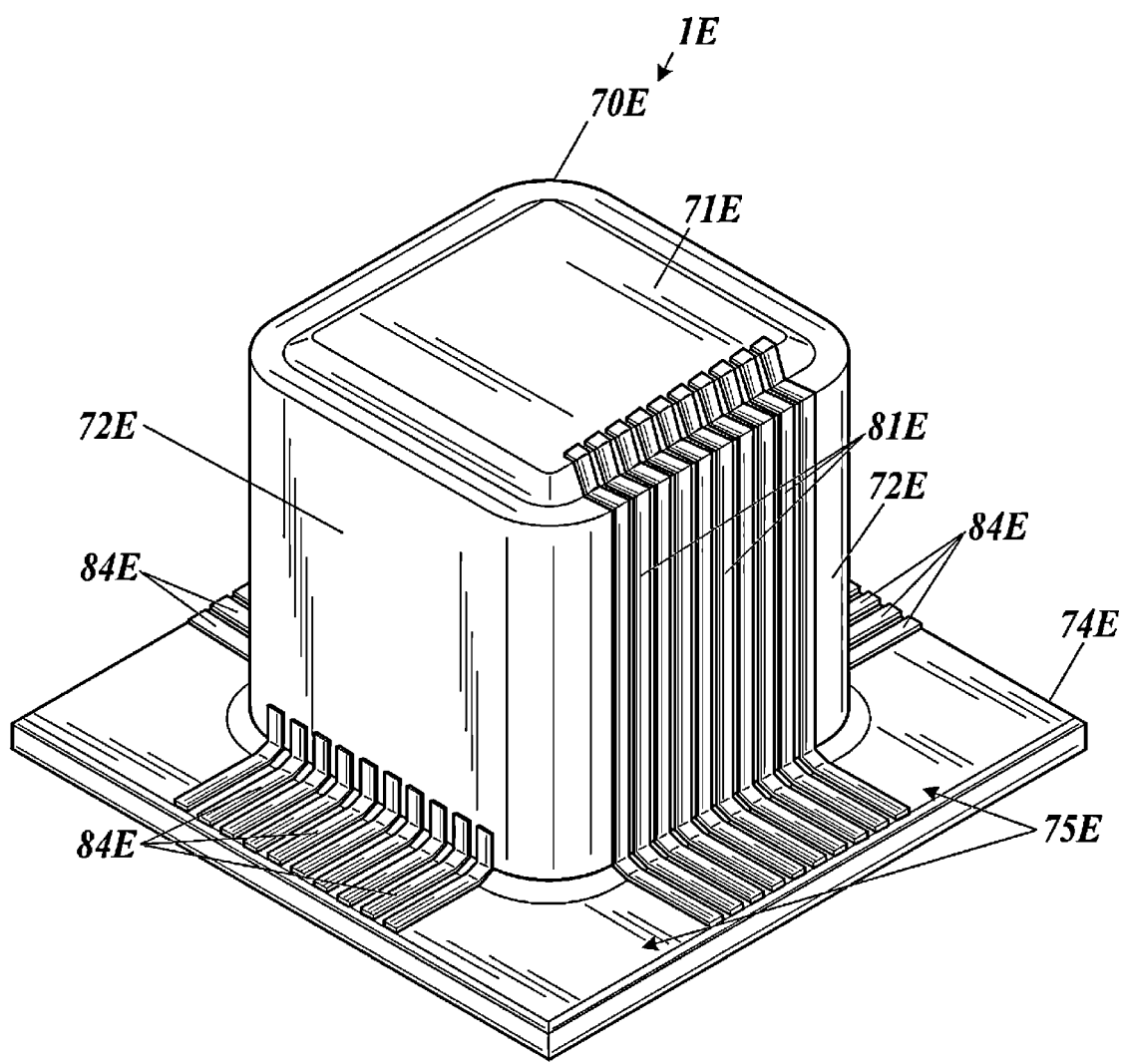
FIG. 12 is a perspective view of a wiring board according to a sixth embodiment.

FIG. 12 is a perspective view of a wiring board according to a sixth embodiment. A wiring board 1E according to the sixth embodiment includes a base 70E, which is an insulator, and wiring conductors 81E and 84E positioned on surfaces of the base 70E.

The base 70E includes a cubic portion having three or more faces (an upper face 71E, one side face 72E having no wiring conductors 81E, and one side face that is not visible in FIG. 12) that are oriented in different directions and on each of which an electronic component can be mounted; and a plate-shaped portion 74E that spreads at the bottom of the cubic portion. The upper face 71E of the base 70E has recessed steps at peripheral edges of the upper face 71E. In the base 70E, the upper face 71E, four side faces, and an upper face 75E of the plate-shaped portion 74E correspond to the first face of the present disclosure.

The wiring conductors 81E and 84E are conductors to be electrically connected to electrodes of electronic components mounted on the above-mentioned three or more faces with bonding wires or a conductive joining material, such as solder. The wiring conductors 81E are positioned to extend along the upper face 71E and one side face 72E of the base 70E and the upper face 75E of the plate-shaped portion 74E. The wiring conductors 84E are positioned to extend along the side face 72E of the base 70E and the upper face 75E of the plate-shaped portion 74E.

The wiring conductors 81E and 84E correspond to the conductor according to the present disclosure. Portions of the wiring conductors 81E that are positioned on the upper face 71E have a plurality of first protrusions that protrude in the same oblique direction that is oblique to a direction normal to the upper face 71E. The portions of the wiring conductors 81E positioned on the upper face 71E may also have a plurality of second protrusions that protrude in the same oblique direction that is oblique to the direction normal to the upper face 71E.

Portions of the wiring conductors 81E that are positioned on the side face 72E have a plurality of first protrusions that protrude in the same oblique direction that is oblique to a direction normal to the side face 72E. The portions of the wiring conductors 81E positioned on the side face 72E may also have a plurality of second protrusions that protrude in the same oblique direction that is oblique to the direction normal to the side face 72E.

Portions of the wiring conductors 81E that are positioned on the upper face 75E of the plate-shaped portion 74E have a plurality of first protrusions that protrude in the same oblique direction that is oblique to a direction normal to the upper face 75E. The portions of the wiring conductors 81E positioned on the upper face 75E of the plate-shaped portion 74E may also have a plurality of second protrusions that protrude in the same oblique direction that is oblique to the direction normal to the upper face 75E.

Portions of the wiring conductors 84E that are positioned on the side face 72E have a plurality of first protrusions that protrude in the same oblique direction that is oblique to a direction normal to the side face 72E. The portions of the wiring conductors 84E positioned on the side face 72E may also have a plurality of second protrusions that protrude in the same oblique direction that is oblique to the direction normal to the side face 72E.

Portions of the wiring conductors 84E that are positioned on the upper face 75E of the plate-shaped portion 74E have a plurality of first protrusions that protrude in the same oblique direction that is oblique to a direction normal to the upper face 75E. The portions of the wiring conductors 84E positioned on the upper face 75E of the plate-shaped portion 74E may also have a plurality of second protrusions that protrude in the same oblique direction that is oblique to the direction normal to the upper face 75E.

The first protrusions and the second protrusions are similar to those described in the first and second embodiments.

Seventh Embodiment

Figure 13:
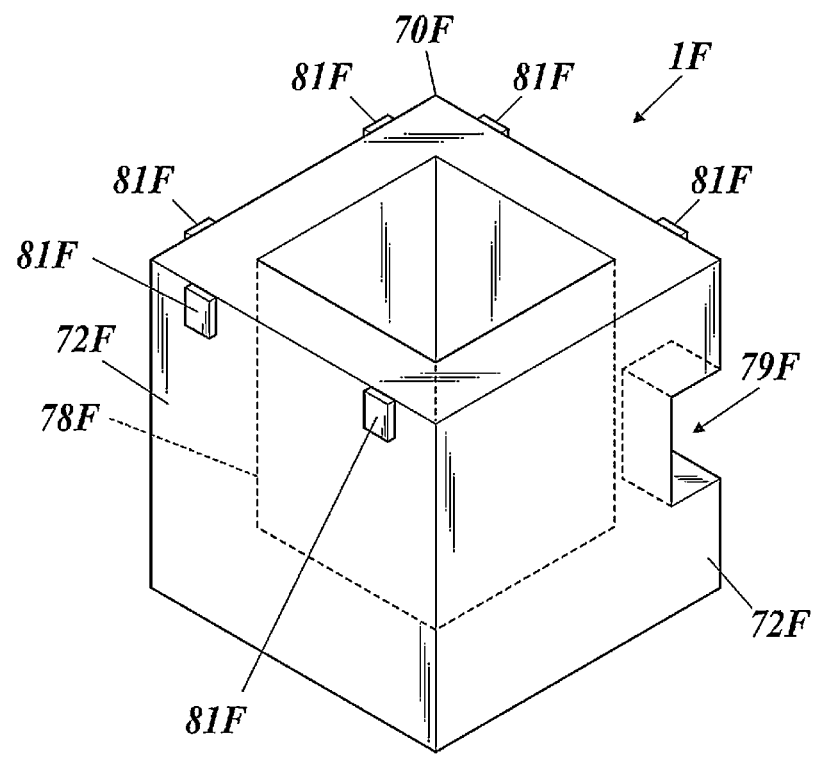
FIG. 13 is a perspective view of a wiring board according to a seventh embodiment.

FIG. 13 is a perspective view of a wiring board according to a seventh embodiment. A wiring board 1F according to the seventh embodiment includes a base 70F having the shape of a polyhedron with hollow spaces and wiring conductors 81F positioned on outer faces 72F of the base 70F. The base 70F may have a hollow space 78F that extends from the center to one side of the polyhedron. The base 70F may also have a hollow space 79F that is exposed at a side portion of the polyhedron. The base 70F is an insulator. Some of the outer faces 72F of the base 70F each serve as a mounting section in which an electronic component is mounted, and these outer faces 72F correspond to the first face according to the present disclosure.

The wiring conductors 81F are conductors to be electrically connected to electrodes of electronic components mounted on the outer faces 72F with bonding wires or a conductive joining material, such as solder. Each wiring conductor 81F has a plurality of first protrusions that protrude in the same oblique direction that is oblique to a direction normal to the outer face 72F of the base 70F on which the wiring conductor 81F is provided. Each wiring conductor 81F may also have a plurality of second protrusions that protrude in the same oblique direction that is oblique to the direction normal to the outer face 72F of the base 70F on which the wiring conductor 81F is positioned. The first protrusions and the second protrusions are similar to those described in the first and second embodiments.

As described above in the third to seventh embodiments, the conductors having the first protrusions or both the first protrusions and the second protrusions function advantageously if used in combination with bases of various wiring boards.

INDUSTRIAL APPLICABILITY

The present disclosure may be applied to a wiring board, an electronic device, and an electronic module.

REFERENCE SIGNS LIST 1, 1A wiring board
10 base
11 first face
12 second face
20 conductor
21 granule
21a first protrusion
21aA first protrusion
21aB first protrusion
25 granule
25a protrusion (second protrusion)
L1 first layer
L2 second layer
g1 space
P1 right end of protrusion
P2 contact end of protrusion
S1 boundary line
J1, J2 pitch
100 electronic module
110 module substrate
150 electronic component
160 electronic device
1B to 1F wiring board
30, 50, 70D, 70E, 70F base
31, 32, 51 first face
52 second face
40 conductor
60, 61 metal film (conductor)
62, 63 wiring conductor (conductor)
71D upper face (first face)
72D side face (first face)
71E upper face (first face)
72E side face (first face)
75E upper face (first face)
72F outer face (first face)
81D, 82D wiring conductor (conductor)
81E, 84E wiring conductor (conductor)
81F wiring conductor (conductor)

The invention claimed is:

1. A wiring board comprising:
a base having a first face; and
a conductor positioned on the first face, wherein
the conductor has a region in which a first protrusion unit is positioned on a surface of the conductor,
the first protrusion unit has a first protrusion and a second protrusion adjacent to the first protrusion,
the first protrusion and the second protrusion each protrude in a first oblique direction that is oblique to a direction normal to the first face,
in the first oblique direction, the first protrusion is longer than the second protrusion, and
in a cross section perpendicular to the first face and extending along the first oblique direction, the first protrusion unit has a first boundary line in which a part of the first protrusion and a part of the second protrusion are in contact with each other, the first boundary line extending from the first face along a first inclination direction.

2. The wiring board according to claim 1, wherein in a cross section orthogonal to the first face, the conductor includes a portion in which a section adjacent to the first protrusion has an outline curved convexly in a direction coinciding with the first oblique direction.

3. The wiring board according to claim 1, wherein the conductor is formed of a plurality of granules in the region, and a direction in which a boundary line between the plurality of granules extends is a direction coinciding with the first oblique direction.

4. The wiring board according to claim 1, wherein the conductor has a space in the region, and
wherein a long-side direction of the space is a direction coinciding with the first oblique direction.

5. The wiring board according to claim 1, wherein the conductor includes a first layer and a second layer that is in contact with the first layer and positioned on the first face,
wherein the second layer has a second protrusion unit in the region, the second protrusion unit protruding in the first oblique direction, and
wherein the first layer is present between pairs of protrusions of the second protrusion unit in the region.

6. The wiring board according to claim 5, wherein at least one protrusion of the second protrusions unit has a width less than a width of the second protrusion,
wherein the at least one protrusion of the second protrusion unit has a height less than a height of the second protrusion, and
wherein the second protrusions unit is arranged at a pitch less than a pitch at which either the first protrusions or the second protrusion are arranged.

7. An electronic device comprising:
the wiring board according to claim 1; and
an electronic component mounted on the wiring board.

8. An electronic module comprising:
the electronic device according to claim 7; and
a module substrate on which the electronic device is mounted.

9. The wiring board according to claim 2, wherein the conductor is formed of a plurality of granules in the region, and a direction in which a second boundary line between the plurality of granules extends is a direction coinciding with the first oblique direction.

10. The wiring board according to claim 2, wherein the conductor has a space in the region, and
wherein a long-side direction of the space is a direction coinciding with the first oblique direction.

11. The wiring board according to claim 3, wherein the conductor has a space in the region, and
wherein a long-side direction of the space is a direction coinciding with the first oblique direction.

12. The wiring board according to claim 9, wherein the conductor has a space in the region, and
wherein a long-side direction of the space is a direction coinciding with the first oblique direction.

13. The wiring board according to claim 2, wherein the conductor includes a first layer and a second layer that is in contact with the first layer and positioned on the first face,
wherein the second layer has a second protrusion unit in the region, the second protrusion unit protruding in the first oblique direction, and
wherein the first layer is present between pairs of protrusions of the second protrusion unit in the region.

14. The wiring board according to claim 3, wherein the conductor includes a first layer and a second layer that is in contact with the first layer and positioned on the first face,
wherein the second layer has a second protrusion unit in the region, the second protrusion unit protruding in the first oblique direction, and
wherein the first layer is present between pairs of protrusions of the second protrusion unit in the region.

15. The wiring board according to claim 9, wherein the conductor includes a first layer and a second layer that is in contact with the first layer and positioned on the first face, wherein the second layer has a second protrusion unit in the region, the second protrusion unit protruding in the first oblique direction, and wherein the first layer is present between pairs of protrusions of the second protrusion unit in the region.

16. The wiring board according to claim 4, wherein the conductor includes a first layer and a second layer that is in contact with the first layer and positioned on the first face, wherein the second layer has a second protrusion unit in the region, the second protrusion unit protruding in the first oblique direction, and wherein the first layer is present between pairs of protrusions of the second protrusion unit in the region.

17. The wiring board according to claim 10, wherein the conductor includes a first layer and a second layer that is in contact with the first layer and positioned on the first face, wherein the second layer has a second protrusion unit in the region, the second protrusion unit protruding in the first oblique direction, and wherein the first layer is present between pairs of protrusions of the second protrusion unit in the region.

18. The wiring board according to claim 11, wherein the conductor includes a first layer and a second layer that is in contact with the first layer and positioned on the first face, wherein the second layer has a second protrusion unit in the region, the second protrusion unit protruding in the first oblique direction, and wherein the first layer is present between pairs of protrusions of the second protrusion unit in the region.

19. The wiring board according to claim 12, wherein the conductor includes a first layer and a second layer that is in contact with the first layer and positioned on the first face, wherein the second layer has a second protrusion unit in the region, the second protrusion unit protruding in the first oblique direction, and wherein the first layer is present between pairs of protrusions of the second protrusion unit in the region.

\* \* \* \* \*